United States Patent
Park

(10) Patent No.: US 7,687,919 B2
(45) Date of Patent: Mar. 30, 2010

(54) INTEGRATED CIRCUIT PACKAGE SYSTEM WITH ARCHED PEDESTAL

(75) Inventor: Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 715 days.

(21) Appl. No.: 11/463,855

(22) Filed: Aug. 10, 2006

(65) Prior Publication Data

US 2007/0108621 A1    May 17, 2007

Related U.S. Application Data

(60) Provisional application No. 60/595,850, filed on Aug. 10, 2005.

(51) Int. Cl.
*H01L 29/40* (2006.01)
(52) U.S. Cl. ............... 257/777; 257/686; 257/E23.001

(58) Field of Classification Search ................. 257/686, 257/723, 777, 784, E23.001
See application file for complete search history.

(56) References Cited

U.S. PATENT DOCUMENTS

| | | | |
|---|---|---|---|
| 5,952,725 A | 9/1999 | Ball | |
| 6,351,028 B1 | 2/2002 | Akram | |
| 6,818,998 B2 * | 11/2004 | Kwon et al. | ................. 257/777 |
| 2004/0026768 A1 | 2/2004 | Taar et al. | |
| 2005/0006746 A1 | 1/2005 | Egawa | |
| 2005/0056871 A1 | 3/2005 | Taar et al. | |

* cited by examiner

*Primary Examiner*—Jack Chen
(74) *Attorney, Agent, or Firm*—Mikio Ishimaru

(57) ABSTRACT

An integrated circuit package system includes an arched pedestal integrated circuit die including an active surface, a die mounting surface, a pedestal portion including an arch intersecting the die mounting surface and having an arch height, and the arch under a portion of the active surface and having an arch width less than the arch height.

20 Claims, 4 Drawing Sheets

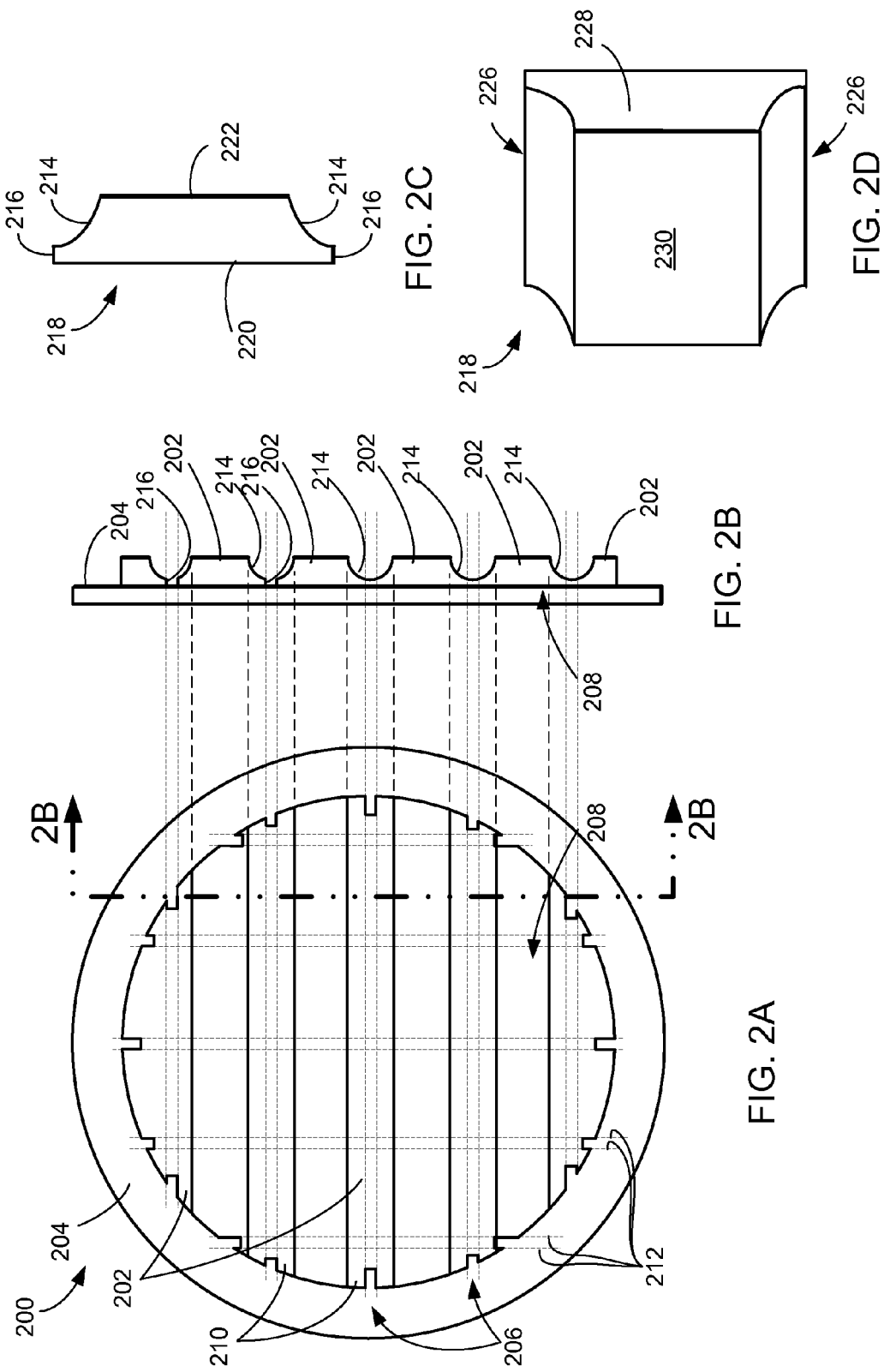

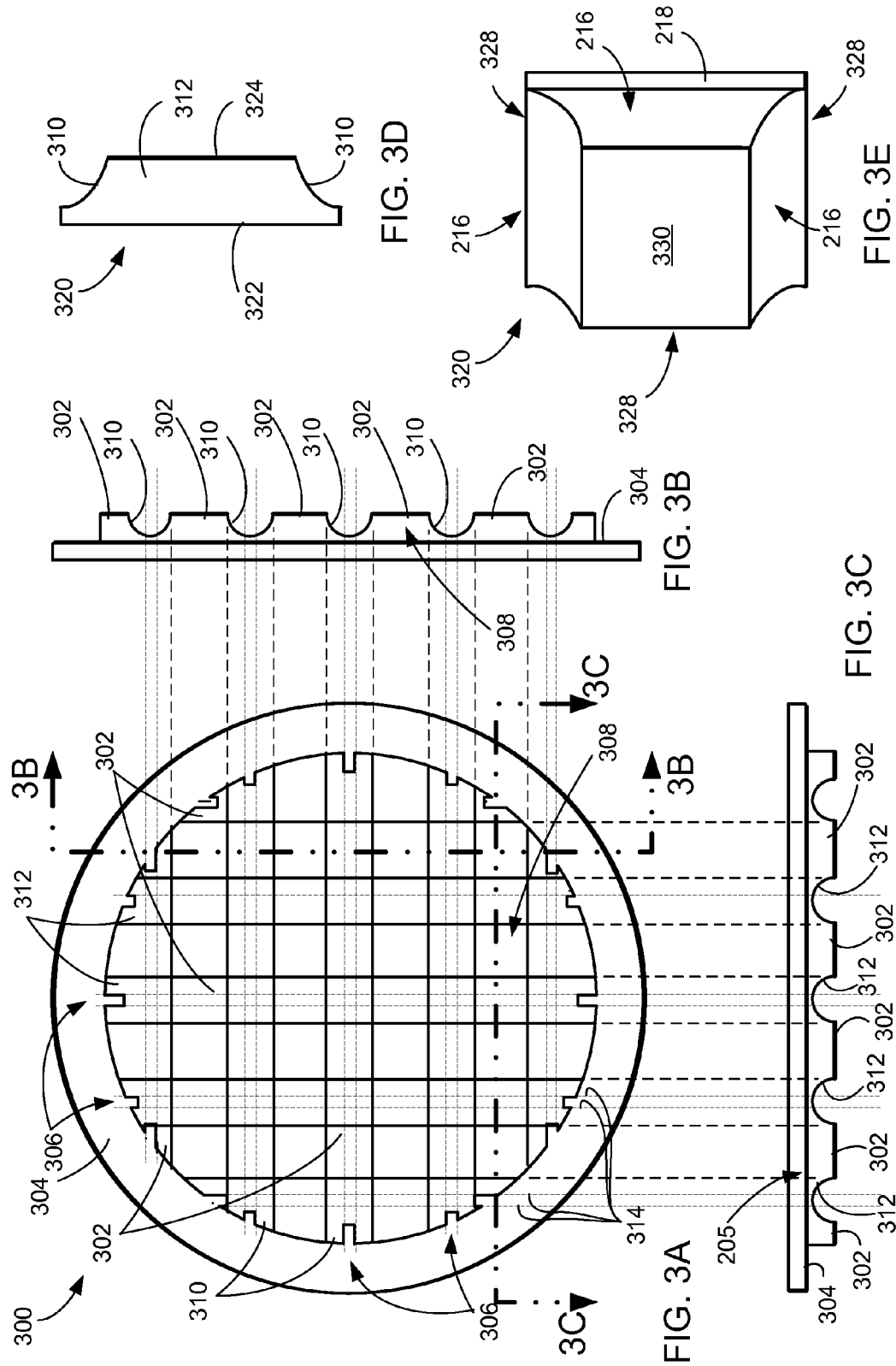

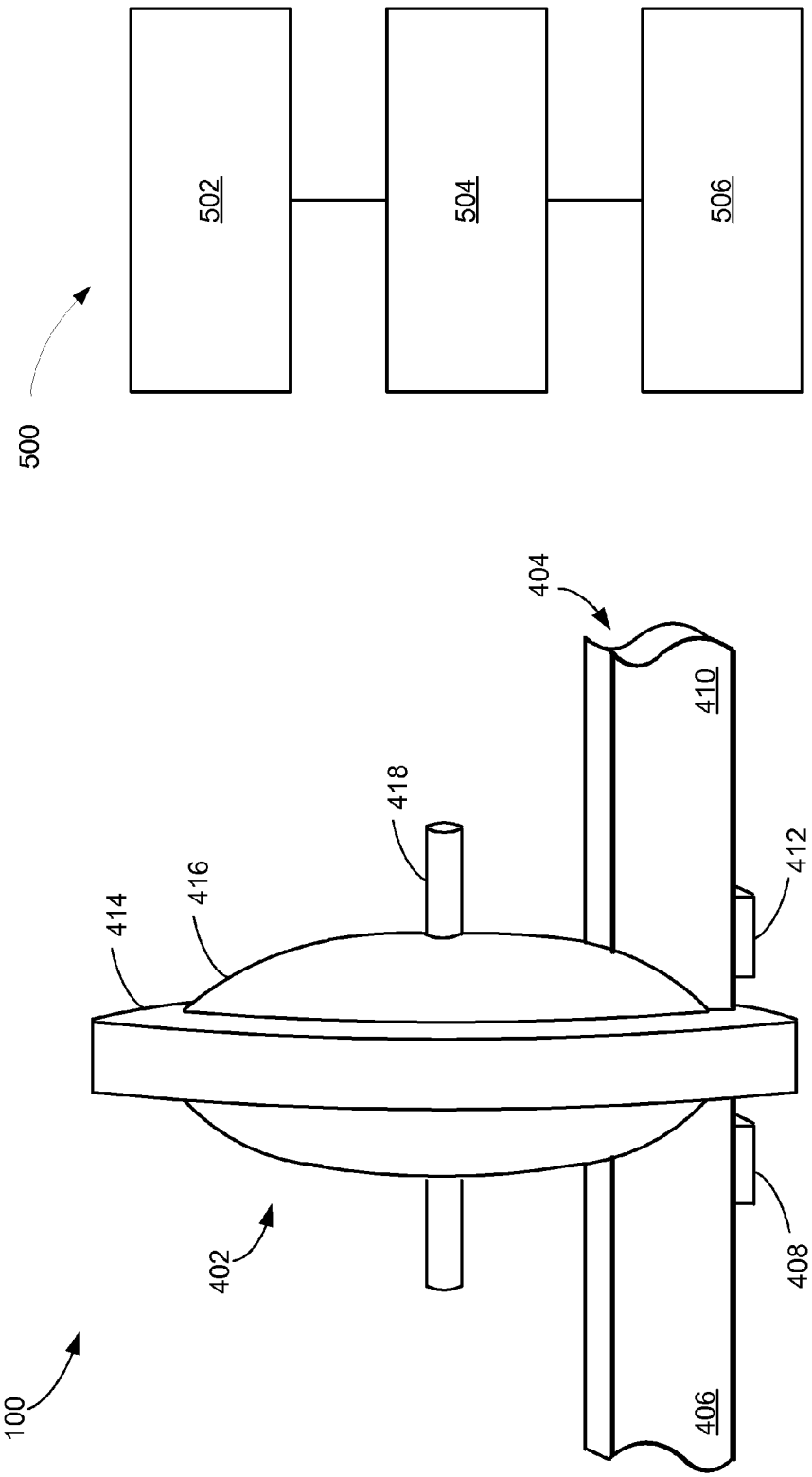

INTEGRATED CIRCUIT PACKAGE SYSTEM WITH ARCHED PEDESTAL

CROSS-REFERENCE TO RELATED APPLICATION(S)

This application claims the benefit of U.S. Provisional Patent Application Ser. No. 60/595,850 filed Aug. 10, 2005.

TECHNICAL FIELD

The present invention relates generally to integrated circuit packages, and more particularly to a system for a package for stacked integrated circuits.

BACKGROUND ART

In the electronics industry, as products such as cell phones and camcorders become smaller and smaller, increased miniaturization of integrated circuit (IC) packages has become more and more critical. At the same time, higher performance and lower cost have become essential for new products.

Usually, many individual integrated circuit devices are constructed on the same wafer and groups of integrated circuit devices are separated into individual integrated circuit die.

In order to interface an integrated circuit die with other circuitry, it is common to mount it on a leadframe or on a multi-chip module substrate that is surrounded by a number of lead fingers. Each die has bonding pads that are then individually connected in a wire bonding operation to the lead fingers of the leadframe using extremely fine gold (Au) or aluminum (Al) wires. The assemblies are then packaged by individually encapsulating them in molded plastic, epoxy, or ceramic bodies.

One approach to putting more integrated circuit dies in a single package involves stacking the dies with space between the dies for wire bonding. The space is achieved by means of a thick layer of organic adhesive or in combination with inorganic spacers of material such as silicon (Si), ceramic, or metal. Unfortunately, the stacking adversely affects the performance of the package because of decreased thermal performance due to the inability to remove heat through the organic adhesive and/or inorganic spacers. As the number of dies in the stack increases, thermal resistance increases at a faster rate. Further, such stacked dies have a high manufacturing cost.

Another approach is to put more integrated circuit dies side-by-side in a single package but this results in packages taking up large areas on the printed circuit boards.

Each attempt to reduce the size of the integrated circuit package tends to create additional problems with cost, heat transfer, and electrical performance.

Across virtually all applications, there continues to be growing demand for increasing capacity and increasing performance of integrated circuit memory. The seemingly endless restrictions and requirements are no more visible than with products in our daily lives. Smaller and denser integrated circuits are expected in many portable electronic products as well as in many larger electronic systems. As the demand grows for smaller electronic products with more features, manufacturers are seeking ways to include more capacity with small product dimensional form factors.

Thus, a need still remains for an integrated circuit package system to provide improved density and manufacturing yield. In view of the increasing demand for improved integrated circuits and particularly more integrated circuit package density, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an arched pedestal integrated circuit die including: forming an active surface, providing a die mounting surface, forming a pedestal portion including: forming an arch intersecting the die mounting surface and having an arch height, and forming the arch under a portion of the active surface and having an arch width less than the arch height.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 2A is an integrated circuit package system in an arch forming phase in an alternative embodiment of the present invention;

FIG. 2B is a cross-sectional view of the structure of FIG. 2A taken along line 2B-2B;

FIG. 2C is a cross-sectional view of a two-edged, arched pedestal integrated circuit die;

FIG. 2D is an isometric view of the structure of FIG. 2C;

FIG. 3A is an integrated circuit package system in an arch forming phase in another alternative embodiment of the present invention;

FIGS. 3B and 3C are cross-sectional views of the structure of FIG. 3A taken along line 3B-3B and line 3C-3C;

FIG. 3D, is a cross-sectional view of a four-edged, arched pedestal integrated circuit die;

FIG. 3E is an isometric view of the structure of FIG. 3D;

FIG. 4 an isometric view of the integrated circuit package system in a singulation phase; and FIG. 5 is a flow chart of an integrated circuit package system for manufacturing the integrated circuit package system in an embodiment of the present invention.

BEST MODE FOR CARRYING OUT THE INVENTION

Figure 1:
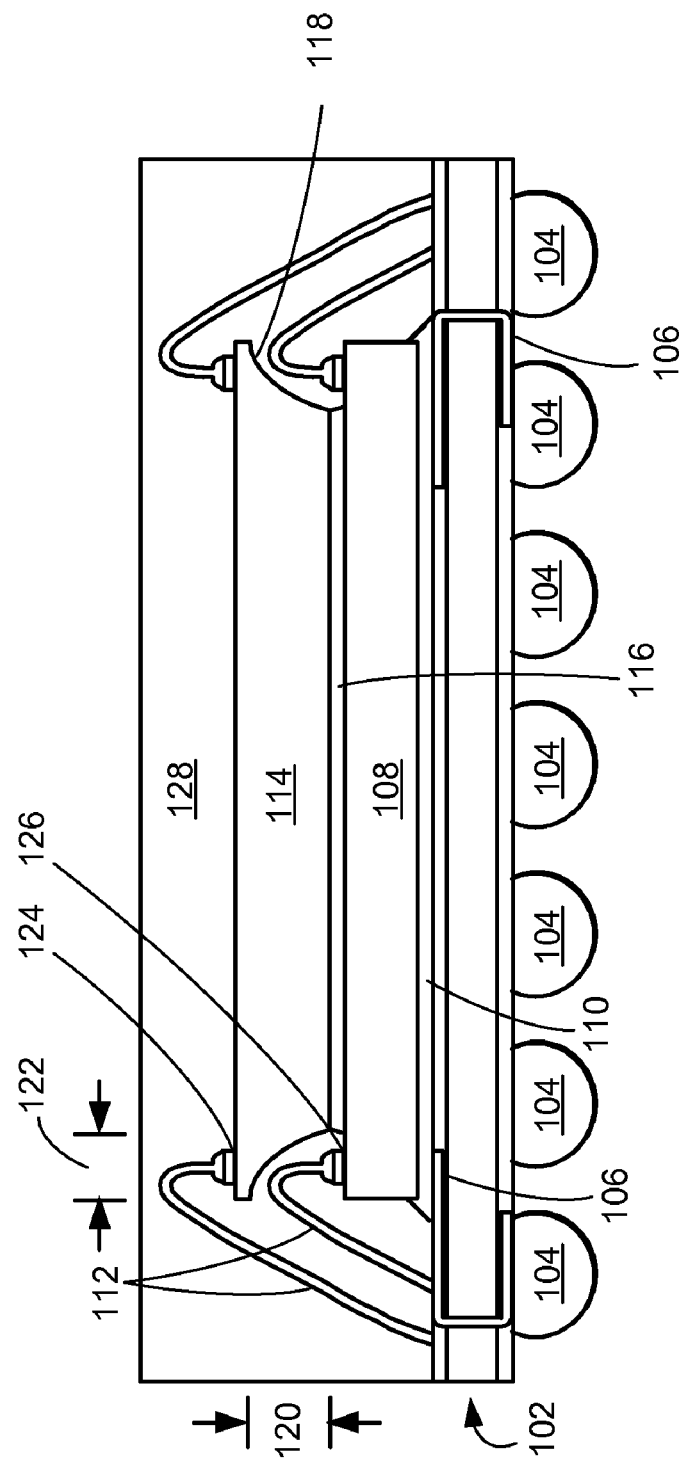
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGS. Similarly, although the sectional views in the drawings for ease of description show the invention with surfaces as oriented downward, this arrangement in the FIGS. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side"(as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in an embodiment of the present invention. The integrated circuit package system 100 includes a package substrate 102, such as a multi-layer substrate or leadframe, having package connectors 104, such as solder balls, connected to conductors 106. A base integrated circuit die 108 is bonded to the package substrate 102 by a base die attach layer 110, such as an adhesive. The base integrated circuit die 108 is connected by electrical connectors 112, such as bond wires, to the package connectors 104 through the conductors 106 in the package substrate 102.

An arched pedestal integrated circuit die 114 is attached to the base integrated circuit die 108 by a pedestal die attach layer 116 such as an adhesive. The arched pedestal integrated circuit die 114 has an arch 118, such as arched singulation edges, formed by a process, such as a singulation process. The arch 118 is formed as a concave shape, such as elliptical or circular, with an arch height 120 and an arch width 122 to provide a region for the electrical connectors 112 on the base integrated circuit die 108. It has been discovered that a ratio between the arch height 120 and the arch width 122 of six to four, 6:4, provides a stable mounting surface for a connection process, such as wire bonding, of the electrical connectors 112 to arched pedestal die pads 124.

The electrical connectors 112 connecting the package substrate 102 to base die pads 126 are formed under the arch 118. The arch 118 can be elliptical, circular or both and guide an encapsulant 128 around the electrical connectors 112. Guiding the encapsulant 128 eliminates bowing and twisting of the electrical connectors 112 during molding and eliminates short-circuits between two or more of the electrical connectors 112. It has also been discovered that the arch 118 provides a stable overhang for the base die pads 126 and the base integrated circuit die 108 during wire bonding preventing broken integrated circuit die defects.

For illustrative purposes, the integrated circuit package system 100 is shown with two integrated circuit die although it is understood that any number of integrated circuit die may be used. Further for illustrative purposes, integrated circuit die are shown although it is understood that other components may be used as well.

Referring now to FIG. 2A, therein is shown an integrated circuit package system 200 in an arch forming phase in an alternative embodiment of the present invention. The integrated circuit package system 200 includes an integrated circuit wafer 202 with a mounting tape 204. The integrated circuit wafer 202 with saw guides 206 is mounted with integrated circuits 208 face down on the mounting tape 204. The bottom of the integrated circuit wafer 202 is then processed by mechanical or chemical means, such as sawing or etching, to form recessed areas 210 that are spaced-apart and parallel.

It should be noted that the saw guides 206 are preformed around the peripheral of the integrated circuit wafer 202 by mounting the integrated circuit wafer 202 with a bottom side of the integrated circuit wafer 202 down on an initial tape (not shown). A process, such as sawing, forms the saw guides 206 aligned with saw streets (not shown) defined by the integrated circuits 208 of the integrated circuit wafer 202. After the saw guides 206 are formed, the integrated circuit wafer 202 is removed from the initial tape and mounted on the mounting tape 204. The saw guides 206 are not only to serve as reference locations for forming the recessed areas 210, but also to allow accurate singulation of the integrated circuit wafer 202 by a process, such as sawing, along lines 212 parallel to and perpendicular to the recessed areas 210.

Referring now to FIG. 2B, therein is shown a cross-sectional view of the structure of FIG. 2A taken along line 2B-2B. The integrated circuit wafer 202 is shown processed with the recessed areas 210 separated by unprocessed thicknesses of the integrated circuit wafer 202. During a singulation process, the integrated circuit wafer 202 will be mechanically separated by a process along the lines 212, which will cut both portions of the full thickness of the integrated circuit wafer 202 as well as portions through the recessed areas 210. A singulation edge is formed with a curved shape for an arch 214 and a rectangular shape for an overhang edge 216.

Referring now to FIG. 2C, therein is shown a cross-sectional view of a two-edged, arched pedestal integrated circuit die 218. The two-edged, arched pedestal integrated circuit die 218 includes an active surface 220 and a pedestal portion 222 having two arched sides. The two-edged, arched pedestal integrated circuit die 218 has the arch shaped cross-section parallel to one of the lines 212, of FIG. 2A, defining at least one singulation side and has a rectangular cross-section perpendicular to the defined singulation side. The two-edged, arched pedestal integrated circuit die 218 provides two regions for the electrical connectors 112 of FIG. 1 as well as a stable mounting surface for the connection process of the electrical connectors 112 to the arched pedestal die pads 124 of FIG. 1.

Referring now to FIG. 2D, therein is shown an isometric view of the structure of FIG. 2C. The two-edged, arched pedestal integrated circuit die 218 includes arched singulation edges 226 and orthogonal singulation edges 228. The arched singulation edges 226 are formed from two of the substantially parallel edges. The orthogonal singulation edges 228 are formed of another two of the substantially parallel edges. The bottom of the pedestal portion 222 provides a die mounting surface 230 on a non-active surface of the two-edged, arched pedestal integrated circuit die 218. The die mounting surface 230 can be attached over the base integrated circuit die 108 of FIG. 1 with the pedestal die attach layer 116 of FIG. 1.

Referring now to FIG. 3A, therein is shown an integrated circuit package system 300 in an arch forming phase in another alternative embodiment of the present invention. The integrated circuit package system 300 includes an integrated circuit wafer 302 mounted on mounting tape 304 and formed in accordance with a second embodiment of the present invention. The integrated circuit wafer 302 with predefined saw guides 306 is mounted with integrated circuits 308 facing down on the mounting tape 304.

The bottom of the integrated circuit wafer 302 is then processed to form first recessed areas 310 that are spaced-apart and parallel. The bottom of the integrated circuit wafer 302 is also processed to form second recessed areas 312, also spaced-apart and parallel that are perpendicular to the first recessed areas 310. The first recessed areas 310 and the second recessed areas 312 are formed by mechanical or chemical processes such as sawing with a round edge diamond saw or an etching process.

It should be noted that the saw guides 306 are preformed around the peripheral of the integrated circuit wafer 302 by mounting the integrated circuit wafer 302 with its bottom side down on an initial tape (not shown). A process, such as sawing, forms the saw guides 306 aligned with saw streets (not shown) defined by the integrated circuits 308 on top of the integrated circuit wafer 302. After the saw guides 306 are formed, the integrated circuit wafer 302 is removed from the initial tape and mounted on the mounting tape 304. The saw guides 306 are not only to serve as reference locations for forming the first recessed areas 310 and the second recessed areas 312, but also to allow accurate singulation of the integrated circuit wafer 302 by sawing along lines 314 parallel to and perpendicular to the first recessed areas 310 and the second recessed areas 312.

Referring now to FIGS. 3B and 3C, therein are shown cross-sectional views of the structure of FIG. 3A taken along line 3B-3B and line 3C-3C. The integrated circuit wafer 302 is shown processed with the first recessed areas 310 and the second recessed areas 312 separated by unprocessed thicknesses of the integrated circuit wafer 302. During a singulation process, the integrated circuit wafer 302 will be mechanically separated by a process, such as sawing, along the lines 314, which will cut both a portion of the full thickness of the integrated circuit wafer 302 as well as a portion through the first recessed areas 310 and the second recessed areas 312. A singulation edge is formed with a curved shape for an arch 316 and a rectangular shape for an overhang edge 318.

Referring now to FIG. 3D, therein is shown a cross-sectional view of a four-edged, arched pedestal integrated circuit die 320. The four-edged, arched pedestal integrated circuit die 320 includes an active surface 322 and a pedestal portion 324 having four arched sides 326. The four-edged, arched pedestal integrated circuit die 320 has the arched shaped cross-section parallel to the lines 314, of FIG. 3A, defining at least one singulation side and has another arch shaped cross-section perpendicular to the defined singulation side. The four-edged, arched pedestal integrated circuit die 320 provides four regions for the electrical connectors 112 of FIG. 1 as well as a stable mounting surface for the connection process of the electrical connectors 112 to the arched pedestal die pads 124 of FIG. 1.

Referring now to FIG. 3E, therein is shown an isometric view of the structure of FIG. 3D. The four-edged, arched pedestal integrated circuit die 320 includes arched singulation edges 328. The arched singulation edges 328 can be formed on all edges of the four-edged, arched pedestal integrated circuit die 320. The bottom of the pedestal portion 324 provides a die mounting surface 330 on a non-active surface of the four-edged, arched pedestal integrated circuit die 320. The die mounting surface 330 can be attached over the base integrated circuit die 108 of FIG. 1 with the pedestal die attach layer 116 of FIG. 1.

Referring now to FIG. 4, therein is shown an isometric view of the integrated circuit package system 100 in a singulation phase. A singulation apparatus 402 is applied to an integrated circuit wafer 404 to individualized a first arched pedestal integrated circuit die 406 having a first die pad 408 and a second arched pedestal integrated circuit die 410 having a second die pad 412.

The singulation apparatus 402 includes multiple devices including a rectangular blade 414 and an arch blade 416. The rectangular blade 414 and the arch blade 416 can include a rotational shaft 418 for rotating the singulation apparatus 402. The singulation apparatus 402 can be rotated about the rotational shaft 418 to provide a mechanical material removal process such as grinding or cutting. The arch blade 416 includes a convex shape, such as elliptical or circular, providing wafer material removal of the arch height 120 and the arch width 122 in a six to four ratio.

It has been discovered that the singulation apparatus 402 provides formation of the arch 118, of FIG. 1, substantially simultaneous to singulation of the first arched pedestal integrated circuit die 406 and the second arched pedestal integrated circuit die 410.

For illustrative purposes, the singulation apparatus 402 is shown having the rectangular blade 414 and the arch blade 416 although it is understood that other blades may be used. Further, for illustrative purposes, the rectangular blade 414 and the arch blade 416 are shown although other shapes may also be used.

Referring now to FIG. 5, therein is shown a flow chart of an integrated circuit package system 500 for forming the arched pedestal integrated circuit die 114 in an embodiment of the present invention. The system 500 includes forming an active surface in a block 502; providing a die mounting surface in a block 504; and forming a pedestal portion in a block 506.

It has been discovered that the present invention thus has numerous aspects.

An aspect is that the present invention provides the arched singulation edges. The arched pedestal integrated circuit die includes the sides formed as the arched singulation edges. The arched simulation edges can be formed as a concave shape, such as elliptical or circular.

Another aspect is that the present invention provides the arch height to arch width ratio of six to four. The arched singulation edges have been formed having the arch height significantly larger than the arch width.

Yet another aspect is that the present invention provides the singulation apparatus. The singulation apparatus can include the rectangular blade, the arch blade, and the rotational shaft for rotating the singulation apparatus.

It has been discovered that the disclosed structure provides for singulating integrated circuit die. The singulation apparatus provides a process to form the arched singulation edges and substantially simultaneously singulate the arched pedestal integrated circuit die.

It has also been discovered that the disclosed structure provides the region for the electrical connectors. The arched singulation edges provide clearance for the electrical connectors on the base integrated circuit die.

Yet another discovery is that that the disclosed structure provides a stable overhang. The six to four ratio of the arch height to arch width creates a small overhang of the arched singulation edges providing structural integrity to the overhang.

Yet another discovery is that that the disclosed structure prevents broken integrated circuit die. The structural integrity provided by the small overhang substantially eliminates breakage of the overhang and arched singulation edges.

Yet another discovery of the disclosed structure is that the arched singulation edges guide the encapsulant around the electrical connectors. The shape and clearance of the sides having arched singulation edges provide a path for the encapsulant flow.

Yet another discovery of the disclosed structure is that formation of the arched singulation edges can be formed simultaneous to singulation of the first arched pedestal integrated circuit die and the second arched pedestal integrated circuit die.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   forming an arched pedestal integrated circuit die including:
      forming an active surface;
      providing a die mounting surface;
      forming a pedestal portion including:
         forming an arch intersecting the die mounting surface and having an arch height; and
         forming the arch under a portion of the active surface and having an arch width less than the arch height.

2. The system as claimed in claim 1 wherein forming the arched pedestal integrated circuit die includes forming a second, third, or fourth arch.

3. The system as claimed in claim 1 further comprising:
   providing a base integrated circuit die; and
   wherein forming the arched pedestal integrated circuit die includes:
      forming the pedestal portion smaller than the base integrated circuit die.

4. The system as claimed in claim 1 further comprising attaching electrical connectors between a package substrate and a base integrated circuit die, between the package substrate and the arched pedestal integrated circuit die, and filling an encapsulant between the arch and the electrical connectors.

5. The system as claimed in claim 1 further comprising:
   providing an integrated circuit wafer;
   applying a singulation apparatus for one-step arch-formation and singulation of the arched pedestal integrated circuit die from the integrated circuit wafer.

6. An integrated circuit package system comprising:
   forming an arched pedestal integrated circuit die including:
      forming an active surface and forming arched pedestal die pads adjacent at least one edge thereof;
      providing a die mounting surface on the opposite side of the die from the active surface;
      forming a pedestal portion including:
         forming an arch intersecting the die mounting surface and having an arch height;
         forming the arch under a portion of the active surface and having an arch width less than the arch height; and
         forming an overhang edge adjacent the portion of the arch adjacent the active surface.

7. The system as claimed in claim 6 wherein forming the arched pedestal integrated circuit die includes forming a second, third, or fourth arch with a ratio between the arch height and the arch width of at least six to four.

8. The system as claimed in claim 6 further comprising:
   providing a base integrated circuit die;
   attaching the die mounting surface of the arched pedestal integrated circuit die over the base integrated circuit die; and
   wherein forming the arched pedestal integrated circuit die includes:
      forming the pedestal portion smaller than the active surface of the arched pedestal integrated circuit die and smaller than the base integrated circuit die.

9. The system as claimed in claim 6 further comprising attaching electrical connectors between a package substrate and a base integrated circuit die, between the package substrate and the arched pedestal integrated circuit die, and wherein the arch guides an encapsulant around the electrical connectors.

10. The system as claimed in claim 6 further comprising:
    providing an integrated circuit wafer;
    applying a singulation apparatus having a rectangular blade and an arch blade with an elliptical or circular shape for one-step arch-formation and singulation of the arched pedestal integrated circuit die from the integrated circuit wafer.

11. An integrated circuit package system comprising:
    an arched pedestal integrated circuit die including:
       an active surface;
       a die mounting surface;
       a pedestal portion including:
          an arch intersecting the die mounting surface and having an arch height; and
          the arch under a portion of the active surface and having an arch width less than the arch height.

12. The system as claimed in claim 11 wherein the arched pedestal integrated circuit die includes a second, third, or fourth arch.

13. The system as claimed in claim 11 further comprising a base integrated circuit and wherein the pedestal portion is smaller than the base integrated circuit die.

14. The system as claimed in claim 11 further comprising electrical connectors between a package substrate and a base integrated circuit die, between the package substrate and the arched pedestal integrated circuit die, and an encapsulant between the arch and the electrical connectors.

15. The system as claimed in claim 11 further comprising an overhang edge adjacent the portion of the arch adjacent the active surface.

16. The system as claimed in claim 11 wherein:
    the arched pedestal integrated circuit die includes:
       the active surface with arched pedestal die pads adjacent at least one edge thereof;
       the die mounting surface on the opposite side of the die from the active surface;
       the pedestal portion including:
          the arch intersecting the die mounting surface and having the arch height, and the arch under a portion of the active surface and having the arch width less than the arch height, and further comprising:

an overhang edge adjacent the portion of the arch adjacent the active surface.

17. The system as claimed in claim 16 wherein the arched pedestal integrated circuit die includes a second, third, or fourth arch with a ratio between the arch height and the arch width of at least six to four.

18. The system as claimed in claim 16 further comprising:
a base integrated circuit die; and
the die mounting surface of the arched pedestal integrated circuit die over the base integrated circuit die; and wherein the arched pedestal integrated circuit die includes:
the pedestal portion smaller than the active surface of the arched pedestal integrated circuit die and smaller than the base integrated circuit die.

19. The system as claimed in claim 16 further comprising electrical connectors between a package substrate and a base integrated circuit die, between the package substrate and the arched pedestal integrated circuit die, and wherein the arch for guiding an encapsulant around the electrical connectors.

20. The system as claimed in claim 16 wherein the overhang edge adjacent the portion of the arch adjacent the active surface, includes a rectangular shape.

* * * * *